(12) United States Patent
Tran et al.

(10) Patent No.: US 6,252,725 B1
(45) Date of Patent: Jun. 26, 2001

(54) SEMICONDUCTOR MICRO EPI-OPTICAL COMPONENTS

(75) Inventors: Dean Tran, Westminister; Eric R. Anderson, Redondo Beach; Ronald L. Strijek, Vista; Edward A. Rezek, Torrance; Luis M. Rochin, Oxnard, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/498,634

(22) Filed: Feb. 7, 2000

Related U.S. Application Data

(62) Division of application No. 09/135,696, filed on Aug. 18, 1998, now Pat. No. 6,074,888.

(51) Int. Cl.[7] ............................. G02B 7/02; H01L 23/58
(52) U.S. Cl. ........................................ 359/811; 257/798
(58) Field of Search ........................... 359/811, 819; 356/246; 385/130; 257/798

(56) References Cited

U.S. PATENT DOCUMENTS

| | | | |
|---|---|---|---|
| 5,037,199 | 8/1991 | Hlousek | 356/246 |
| 5,054,871 | * 10/1991 | Deri et al. | 385/30 |
| 5,514,888 | 5/1996 | Sano et al. | 257/232 |

* cited by examiner

Primary Examiner—Ricky Mack
(74) Attorney, Agent, or Firm—Michael S. Yatsko

(57) ABSTRACT

A method for fabricating a monolithic micro-optical component. The construction of the micro-optical components is accomplished by using standard semiconductor fabrication techniques. The method comprises the steps of depositing an etch stop layer (44) onto a semiconductor substrate (42); depositing an optical component layer (46) onto the etch stop layer (44); coating the entire surface of the optical component layer with a photoresist material; applying a photoresist mask (50) to the photoresist material on the optical component layer (46); selectively etching away the optical component layer (46) to form at least one optical column (52); forming a pedestal (54) for each of the optical columns (52) by selectively etching away the etch stop layer (44); and finally polishing each of the optical columns (52), thereby forming monolithic optical components (56). The method may optionally include the step of removing the photoresist mask from each of the optical columns prior to polishing the optical columns, as well as the step of depositing an antireflectivity coating onto each of the optical components.

7 Claims, 2 Drawing Sheets

SEMICONDUCTOR MICRO EPI-OPTICAL COMPONENTS

This application is a divisional of application Ser. No. 09/135,696 filing date Aug. 18, 1998, U.S. Pat. No. 6,074,888.

BACKGROUND OF THE INVENTION

1. Field of the Invention

This invention relates generally to micro-optical components and, more particularly, to a method for producing monolithic micro-optical components using standard semiconductor fabrication techniques.

2. Discussion of the Related Art

Compact and simple lens systems for micro-optical devices are essential in optical communication systems. Generally, an optical communication system is comprised of independently fabricated micro-optical components that are attached to microbenches. Present optical systems use a variety of techniques for fabricating micro-optical components and for obtaining efficient coupling between micro-optical components and other micro-optical devices. For instance, these optical systems might be manually assembled from very small parts by persons using tweezers and a microscope. Although this manual approach may be feasible for limited quantities of systems, difficulty remains in achieving high output production. On the other hand, current automated assembly techniques fail to achieve the precision alignment and quality needed for most microcomponent systems.

Therefore, it is desirable to provide a monolithic micro-optical system for use in various optical communication applications. Since there are less individual components to align, the complexity of the assembly process will be decreased. Some assembly steps are entirely eliminated with the formation of a monolithic structure. This reduction in assembly complexity improves alignment accuracy, increases reliability and decreases assembly costs for a micro-optical system. The present invention solves these problems by using standard semiconductor fabrication techniques to manufacture a monolithic micro-optical system.

SUMMARY OF THE INVENTION

The present invention relates to a method for fabricating monolithic micro-optical components. The construction of the micro-optical components is accomplished by using standard semiconductor fabrication techniques. The method comprises, in one embodiment, the steps of depositing an etch stop layer onto a semiconductor substrate; depositing an optical component layer onto the etch stop layer; coating the entire surface of the optical component layer with a photoresist material; applying a photoresist mask to the photoresist material on the optical component layer; selectively etching away the optical component layer to form at least one optical column; forming a pedestal for each of the optical columns by selectively etching away the etch stop layer; and finally polishing each of the optical columns, thereby forming monolithic optical components. The method may optionally include the step of removing the photoresist mask from each of the optical columns prior to polishing the optical columns, as well as the step of depositing an antireflectivity coating onto each of the optical components.

BRIEF DESCRIPTION OF THE DRAWINGS

Other objectives and advantages of the present invention will be apparent to those skilled in the art upon reading the following detailed description and upon reference to the drawings in which.

DETAILED DESCRIPTION OF THE PREFERRED EMBODIMENTS

While the invention is described herein with reference to illustrative embodiments for particular applications, it should be understood that the invention is not limited thereto. Those having ordinary skill in the art and access to the teachings provided herein will recognize additional modifications, applications and embodiments within the scope thereof and additional fields in which the present invention would be of significant utility.

Figure 1:
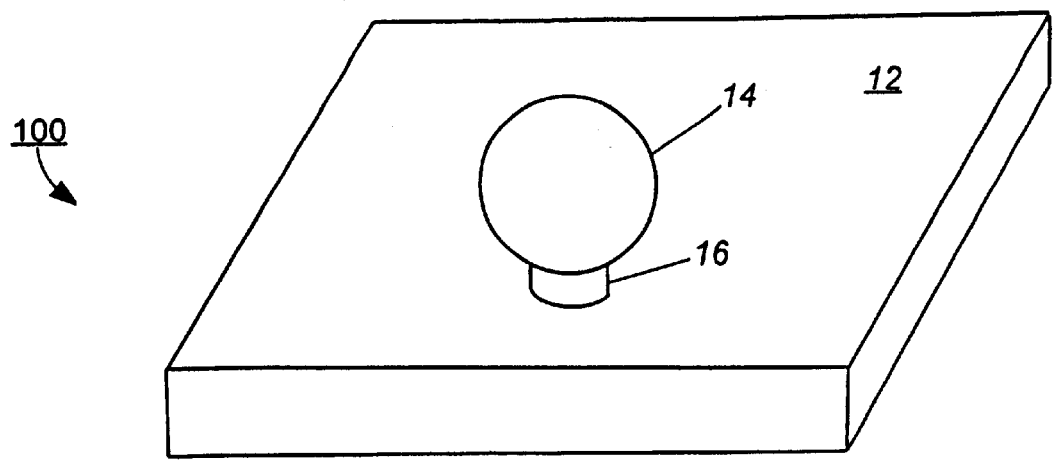
FIG. 1 is a perspective view of a micro-optical system having a micro-optical component in accordance with the present invention.

A micro-optical system 10 for use in an optical fiber network application is depicted in FIG. 1. Micro-optical system 10 is a monolithic structure that is created (as further described below) using standard semiconductor fabrication techniques. Micro-optical system 10 includes an micro-optical component 14 connected by a pedestal 16 to a semiconductor substrate 12. The micro-optical component 14 is shown as a spherical ball lens, but is intended to represent various optical components, such as a cylindrical or conical lens, a concave or convex lens, a prism or any other related optical devices. Each of these components or combinations thereof serve to focus light or redirect an optical beam between other photonic components (e.g., receivers, transmitters and repeaters) and may be used to construct a micro-optical system.

Figure 2:
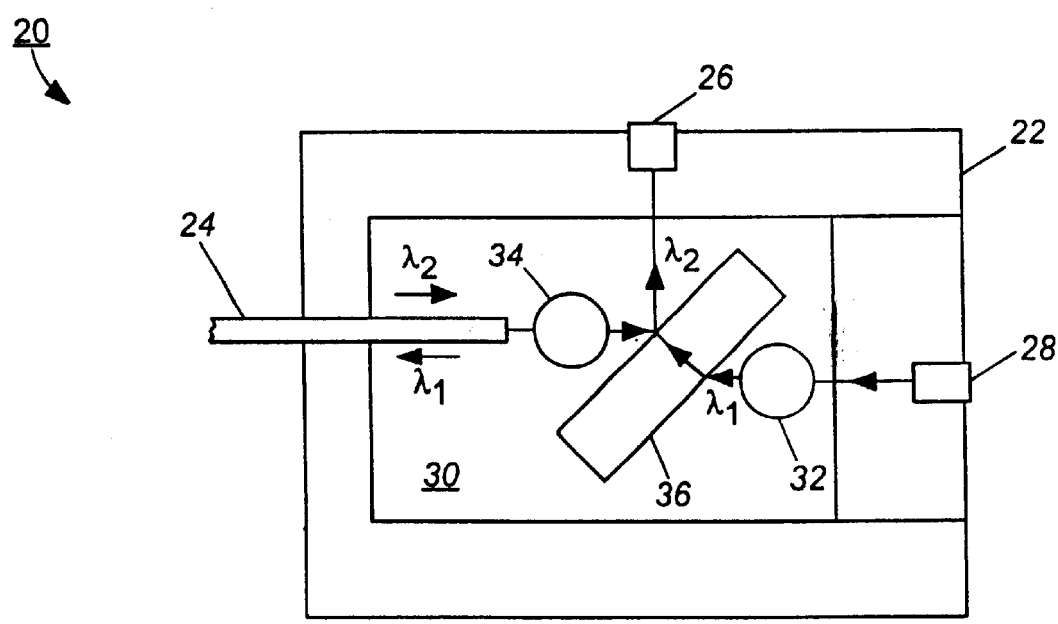
FIG. 2 is a top view of a micro-optical duplexer system implementing an exemplary micro-optical component of the present invention.

A micro-optical duplexer 20 is depicted in FIG. 2 as an exemplary implementation of a micro-optical system in an optical fiber network application. Micro-optical duplexer 20 is being used as a bi-directional transceiver in a fiber network. Micro-optical duplex 20 includes a microbench 30 that is mounted onto a housing 22 (e.g., Kovar housing) which has a feedthrough for an optic fiber 24. A single-mode fiber 24 serves as the connection to a remote fiber network (not shown). A photo diode 26 and laser diode 28 are also mounted to housing 22. The tolerances in positioning and fixing these active devices on housing 22 are on the order of microns.

Microbench 30 (4 mm×14 mm×1 mm) provides the various passive micro-optical components needed by the system. A right spherical lens 32, a left spherical lens 34 and a wavelength filter 36 are each formed and passively aligned on microbench 30. In order to have a collimated laser beam for a distance of several millimeters, these spherical lenses have a diameter on the order of 900 um. To achieve the high accuracy that is required for this passive alignment, microbench 30, including these micro-optical components, are fabricated in accordance with the principles of the present invention.

In operation of the duplexer 20, light with the wavelength $\lambda=1300$ nm is emitted from laser diode 28 and collimated by right spherical lens 32 before being passed through wave-filter 36 and focused onto the end face of the single-mode fiber 24. Light with the wavelength $\lambda=1550$ nm enters through fiber 24 and is collimated by left spherical lens 34 prior to being reflected at wavelength filter 36 and detected by photo diode 26. While depicting these micro-optical components in the context of a micro-optical duplexer, this discussion is intended to adequately teach one skilled in the art to implement micro-optical components of the present invention in a variety of optical applications.

Figure 3:
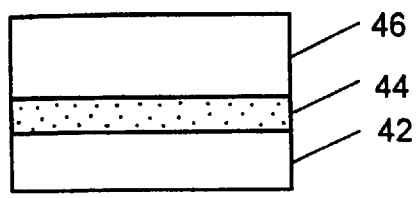
FIG. 3 is a side view illustration of a semiconductor wafer in accordance with the present invention.

FIGS. 3–9 illustrate the steps for fabricating a micro-optical component of the present invention. FIG. 3 shows a side view of a typical semiconductor wafer 40. Commonly known epitaxy techniques (i.e., LPE, MOCVD, etc.) are used to grow precisely calibrated thin single-crystal semiconductor layers. An indium phosphide (InP) substrate 42 serves as a microbench for the micro-optical components. A pedestal layer 44 with a thickness on the order of 2–5 microns is deposited onto substrate 42. This layer is comprised of a ternary material (i.e. InGaAs or AlInAs) quaternary material (ie., InGaAsP) and determines the pedestal height for each optical component. Using the accuracy of the epi-crystal growth technology, the pedestal height can be controlled at the angstroms tolerance level. An optical component layer 46 is then deposited onto pedestal layer 44. Optical component layer 46 should be deposited at a thickness correlating to the maximum required lens dimensions (at least 20 microns thick). Indium phosphide (InP) is also chosen for optical component layer 46 because of its etching characteristics as well as its ability to form a high index lens with low aberrations.

In an alternative preferred embodiment, the optical component layer 46 and substrate 42 may be comprised of gallium arsenide (GaAs), whereas the pedestal layer 44 is comprised of aluminum gallium arsenide (AlGaAs). It is important to note that other materials can be used for these various layers. For example, the optical component layer 46 and substrate 42 may be any III–V semiconductor material and may include indium phosphide (InP), gallium arsenide (GaAs), indium arsenide (InAs) and gallium phosphide (GaP). Moreover, although two different materials having similar thermal expansion coefficients may be used, the same material is preferably used for both optical component layer 46 and microbench substrate 42. In this way, optical alignment problems caused by thermal expansion are minimized in optical applications where wide temperature variations are common (i.e., in military and space applications).

Photolithography and other known wafer fabrication techniques are then used to fabricate the optical components. First, a photoresist coating is applied over the entire surface of the optical component layer 46. The preferred photoresist material is 2-ethoxpyethylacetate (60%) and n-butyl acetate (5%) in xylene and hexamethyldisilozane (HDMS) because of its suitability for use in the dry etching of deep profiles on indium phosphide (InP) and related semiconductor materials. Photoresist material may also include 2-ethoxyethylacetate+n-butyl acetate in xylene solvent, 2-ethoxyethylacetate+n-butyl acetate in xylene and silicon dioxide ($SiO_2$) precoated, 2-ethoxyethylacetate+n-butyl acetate in xylene and silicon nitride ($Si_3N_4$) precoated, silicon dioxide ($SiO_2$) and complex silicon nitride ($Si_xN_y$), or aluminum oxide ($Al_2O_3$) precoated.

Figure 5:
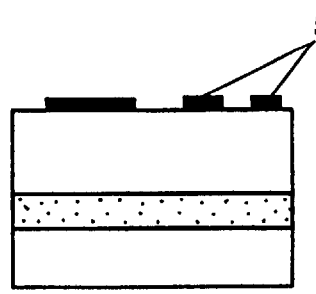
FIG. 5 is side view illustration of a photoresist mask in accordance with the present invention.
Figure 4:
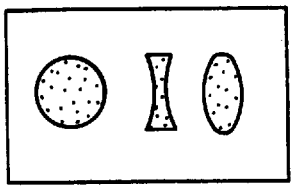
FIG. 4 is a top view illustration of a photoresist mask in accordance with the present invention.

A mask is used to transfer a lens pattern onto the optical component layer. Lens patterns are chosen based on the quantity and type of lens required for a particular optical application. As will be apparent to one skilled in the art, an initial lens shape is dependent on the particular mask design. Depending on the type of optical component (e.g., spherical ball lens, cylindrical ball lens, conical ball lens, convex lens, concave lens, prism, or a combination of these components), a corresponding mask will be used to establish the shape of the initial optical column. As best seen in FIG. 4, a mask is a pattern in which the regions to be exposed are opaque and the protected regions are shaded. The mask is aligned with optical component layer 46 such that when the photoresist material is exposed to an ultraviolet (UV) light source through the mask, the appropriate lens pattern is transferred onto the surface of the optical component layer. As a result, a photoresist mask 50, as illustrated in FIG. 5, is formed on the surface of optical component layer 46.

Figure 6:
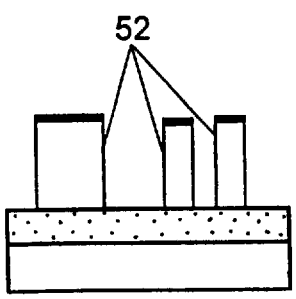
FIG. 6 is side view illustration of initial optical columns being formed by selectively etching away an optical component layer in accordance with the present invention.

Next, initial optical columns for each of the micro-optical components is formed by dry etching away the unwanted optical component material. These initial optical columns 52 are shown in FIG. 6. As will be apparent to one skilled in the art, electron cyclotron resonance (ECR) etching, inductive couple plasma (ICP) etching or reactive-ion etching (RIE) are commonly employed dry etching techniques. Dry etch mixtures may include argon and hydrochloric acid (Ar/HCl), argon hydrogen and chlorine ($AR/Cl_2/H_2$), argon and hydrobromic acid (Ar/HBr), argon and bromine ($Ar/Br_2$), argon and chlorine ($Ar/Cl_2$), argon and methane and hydrogen ($Ar/CH_4/H_2$), methyl iodide ($H_3Cl$), bromine iodide (IBr), methane and hydrogen and sulfur fluoride ($CH_4/H_2/SF_6$), ethyl iodide ($C_2H_5I$), isoethyl iodide ($C_3H_7I$), hexafluoride carbon and hydrogen ($C_2F_6/H_2$), or dichloro-difluoro carbon and oxygen ($CCl_2F_2/O_2$).

Figure 7:
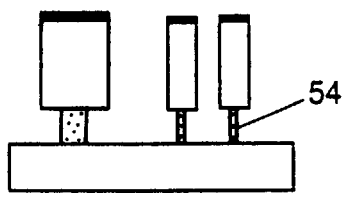
FIG. 7 is a side view illustration of pedestals being formed by an undercutting etching process in accordance with the present invention.

Referring to FIG. 7, wet selective etching with controlled undercutting will provide a pedestal support or stem 54 for each of these optical columns. By using a selective (quaternary) etching solution, pedestal layer 44 is selectively removed from underneath the optical columns without effecting the binary or other material comprising the optical columns and substrate layer. Moreover, this undercutting etching approach provides sufficient space below each of the optical columns for polishing and subsequent formation of the optical components. Wet selective etching chemicals may include potassium hydroxide:potassium ferricyanide:deionized water ($KOH:K_3Fe(CN)_6:H_2O$), lactic acid:nitric acid (10 $CH_3CH_2OCOOH:HNO_3$), hydrochloric acid:nitric acid ($HCl:n\ HNO_3$, where n>5), phosphoric acid:hydrogen peroxide:deionized water ($H_3PO_4:H_2O_2:8H_2O$), nitric acid ($HNO_3$), sulfuric acid:hydrogen peroxide:deionized water ($H_2SO_4:H_2O_2:H_2O$), nitric acid:tartaric acid:deionized water (n $HNO_3:HOOC(CH_2O)_2COOH:H_2O$, where n between 1 and 10) and hydrofluoric acid:hydrogen peroxide:deionized water ($HF:H_2O_2$:n $H_2O$, where n between 1 and 20).

Figure 8:
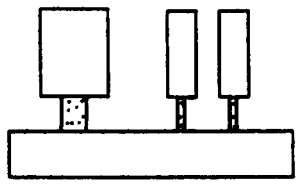
FIG. 8 is a side view illustration of the selectively etched surface of the optical columns, where the photoresist mask has been removed in accordance with the present invention.

After the above-described etching process, the photoresist coating is removed from the optical component layer in FIG. 8. Using acetone, the photoresist mask is removed from the surface of the optical columns. Following the removal of the photoresist mask, the acetone is removed from the surface of the optical columns with isopropanol and then the isopropanol is removed from the surface of the optical columns using deionized water. The photoresist can also be removed using photoresist stripper, potassium hydroxide, or other equivalent alkaline chemicals followed by a deionized water rinse. Finally, oxides and photoresist residues are removed from the surface of the optical columns using potassium hydroxide (KOH).

Figure 9:
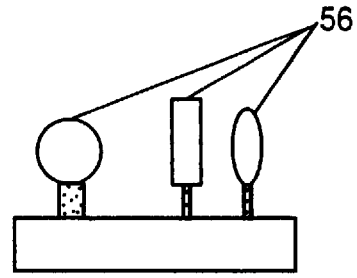
FIG. 9 is a side view illustration optical components that have been polished into shape in accordance with the present invention.

Lastly, these optical columns are further etched and polished into optical components 56 as seen in FIG. 9. A selective wet etching process continues the formation process of an optical component For instance, a weak non-orientation binary selective etching solution (e.g., hydrofloric acid:hydrobromic acid (1HF:10HBr), hydrobromic acid:acetic acid ($HBr:CH_3COOH$) or hydrochloric acid:propylene glycol ($HCl:CH_3CHOHCH_2OH$)) can be used to polish and round off the edges and corners of the optical column. Since this solution will etch the corners and edges faster than other portions of the optical columns, the corners are rounded off to form lenses, thereby shaping the optical columns into optical components. It should also be noted that this solution should not etch the quaternary material of the pedestals.

Furthermore, a weak chemical polishing solution (e.g., hydrobromic acid:acetic acid:deionized water(n $HBr:CH_3COOH:H20$, where n between 1 and 4), or hydrochloric acid:propylene glycol ($HCl:CH_3CHOHCH_2OH$)) can be used to polish the surfaces of an optical column. In this case, polishing is usually performed at a very low temperature, typically between –10 degrees and 20 degrees centigrade. To polish the surface of optical lens, emerge the wafer which contains the formed lens into the polishing solution, agitate the wafer for a calibrated period of time and then rinse in deionized water. Allow wafer to dry before proceeding to the remaining steps.

Once an optical component has been formed, an antireflectivity or filtering coating can also be applied to any one of these optical components to maximize transmitted light. For the present invention, a crystal mixture of antireflectivity (AR) coating which contains magnesium fluoride (MgF), aluminum oxide ($Al_2O_3$), hafnium fluoride (HfF), silicon dioxide ($SiO_2$), and silicon nitride ($Si_3N_4$) is deposited over the entire surface of each optical component. This coating may be applied by using electron beam evaporation, sputtering, chemical vapor deposition, or other similar processes.

The foregoing discloses and describes merely exemplary embodiments of the present invention. One skilled in the art will readily recognize from such discussion, and from the accompanying drawings and claims, that various changes, modifications and variations can be made therein without departing from the spirit and scope of the present invention.

What is claimed is:

1. A micro-optical system for optical signal processing, comprising:

a semiconductor substrate;

an optical component being formed from an epitaxial optical component layer deposited on said substrate; and a pedestal coupling said optical component to said substrate being formed from a stop etch layer, said stop etch layer being interposed between said optical component layer and said substrate.

2. The micro-optical system of claim 1 wherein said optical component being selected from the group consisting of a spherical ball lens, a cylindrical ball lens, a conical ball lens, a convex lens, a concave lens and a prism.

3. The micro-optical system of claim 1 wherein said optical components and said substrate being comprised of material having substantially similar thermal expansion coefficients for improving optical alignment.

4. The micro-optical system of claim 1 wherein said optical components layer and said substrate being comprised of a material selected from the group consisting of indium phosphide (InP), gallium arsenide (Gas), indium arsenide (InAs) and gallium phosphide (GaP).

5. The micro-optical system of claim 1 wherein said optical components layer comprises a layer at least 20 microns thick.

6. The micro-optical system of claim 1 wherein said etch stop layer being comprised of a material selected from the group consisting of indium gallium arsenide phosphide (InGaAsP) and aluminum gallium arsenide (AlGaAs), InGaAs (Indium Galium Arsenide).

7. The micro-optical system of claim 1 wherein said etch stop layer comprises a layer at least 2 microns thick.

* * * * *